United States Patent
Price et al.

(10) Patent No.: US 10,041,984 B1
(45) Date of Patent: Aug. 7, 2018

(54) INPUT VOLTAGE SENSE CIRCUIT FOR BOOST POWER FACTOR CORRECTION IN ISOLATED POWER SUPPLIES

(71) Applicant: Universal Lighting Technologies, Inc., Madison, AL (US)

(72) Inventors: Scott Price, Madison, AL (US); Stephen D. Mays, II, Madison, AL (US); John J. Dernovsek, II, Madison, AL (US); Dane Sutherland, Madison, AL (US); Keith Davis, Madison, AL (US); Wei Xiong, Madison, AL (US)

(73) Assignee: Universal Lighting Technologies, Madison, AL (US)

( * ) Notice: Subject to any disclaimer, the term of this patent is extended or adjusted under 35 U.S.C. 154(b) by 0 days.

(21) Appl. No.: 15/668,147

(22) Filed: Aug. 3, 2017

Related U.S. Application Data

(60) Provisional application No. 62/370,423, filed on Aug. 3, 2016.

(51) Int. Cl.
| | |
|---|---|
| *H05B 37/02* | (2006.01) |
| *G01R 19/04* | (2006.01) |
| *H05B 33/08* | (2006.01) |
| *G05F 1/70* | (2006.01) |
| *G01R 19/00* | (2006.01) |

(52) U.S. Cl.
CPC ......... *G01R 19/04* (2013.01); *G01R 19/0084* (2013.01); *G05F 1/70* (2013.01); *H05B 33/0809* (2013.01); *H05B 33/0812* (2013.01); *H05B 33/0815* (2013.01); *H05B 33/0842* (2013.01); *H05B 33/0845* (2013.01)

(58) Field of Classification Search
CPC ............ H05B 33/0809; H05B 33/0815; H05B 33/0842; H05B 33/0845; H05B 33/0812
USPC ......................................... 315/224, 274, 307
See application file for complete search history.

(56) References Cited

U.S. PATENT DOCUMENTS

| | | | |
|---|---|---|---|
| 6,967,585 B2 | 11/2005 | Lomax, Jr. et al. | |
| 8,829,819 B1* | 9/2014 | Angeles ............. | H05B 33/0815 |
| | | | 315/219 |
| 8,947,015 B1* | 2/2015 | Xiong ................ | H05B 41/3924 |
| | | | 315/224 |
| 9,544,951 B1* | 1/2017 | O'Neil ............... | H05B 33/0815 |
| 2011/0175543 A1* | 7/2011 | Sun .................... | H05B 33/0818 |
| | | | 315/291 |

(Continued)

*Primary Examiner* — Tung X Le
(74) *Attorney, Agent, or Firm* — Patterson Intellectual Property Law, P.C.; Gary L. Montle; Grant M. Ford

(57) ABSTRACT

A system for a linear isolated power supply circuit may include a boost converter having a boost inductor winding and an auxiliary side winding, the auxiliary side winding configured to be magnetically coupled to the boost inductor winding. The linear isolated power supply circuit includes a voltage sensing circuit coupled to the auxiliary side winding, the voltage sensing circuit configured to measure an input voltage at an isolated circuit associated with the auxiliary winding. The linear isolated power supply circuit includes a processor configured to receive the measured input voltage from the voltage sensing circuit and to cause at least one operation to be performed by the processor based at least in part upon the measured input voltage. Methods and apparatuses corresponding to the system are provided.

17 Claims, 17 Drawing Sheets

(56) References Cited

U.S. PATENT DOCUMENTS

2011/0292704 A1* 12/2011 Makino ............... H02M 1/4208
   363/126
2015/0062978 A1* 3/2015 Lee ..................... H02M 1/4258
   363/21.16
2016/0353533 A1* 12/2016 Gyoten .............. H05B 33/0815

* cited by examiner

INPUT VOLTAGE SENSE CIRCUIT FOR BOOST POWER FACTOR CORRECTION IN ISOLATED POWER SUPPLIES

CROSS-REFERENCES TO RELATED APPLICATIONS

This application claims benefit of U.S. Provisional Patent Application No. 62/370,423, dated Aug. 3, 2016, and which is hereby incorporated by reference in its entirety.

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

BACKGROUND OF THE INVENTION

The present invention relates generally to an input voltage sensing circuit for example for use with boost power factor correction in isolated power supplies and corresponding systems and methods.

Providing input voltage sensing for use with isolated power supplies is difficult. There are at least three types of circuits which have been attempted, including: (i) an attenuation network, (ii) a transformer connected to a power mains or rectified mains, and (iii) a flyback topology.

An attenuation network (e.g., a voltage divider) may be connected to a power input mains (e.g., an alternating current (AC) mains) or a rectified power input mains. Disadvantages associated with using an attenuation network include the inability for an attenuated signal to be available at an isolated secondary side and the attenuation network consuming a significant quantity of power, thereby decreasing overall system efficiency.

Numerous disadvantages exist for systems having a transformer connected to a power input or rectified mains. For example, to operate at typical power input mains frequencies such as 50 or 60 Hz, the magnetizing inductance of the transformer's primary winding must be high to avoid saturation. A high magnetizing inductance requires a large magnetic device, thereby increasing cost and requiring a significant amount of printed circuit board (PCB) space.

Sense circuits have been used to detect input voltage sensing in a line powered network (for example, as in U.S. Pat. No. 6,967,585 to Lomax, Jr. et al.). However, these sense circuits are described as using a flyback topology, and an indirect input voltage measurement must be sensed during a particular interval of a switching cycle (see, e.g., FIGS. 1 and 4 of Lomax, Jr.). As such, ease of use and applicability of a flyback topology is limited and is not robust.

BRIEF SUMMARY OF THE INVENTION

It is thus desirable to provide a linear isolated power supply circuit for a light emitting diode (LED) driver. According to one aspect of the systems and methods disclosed herein, a linear isolated power supply circuit may include a boost converter having a boost inductor winding and an auxiliary side winding. The auxiliary side winding may be configured to be magnetically coupled to the boost inductor winding. The linear isolated power supply circuit further includes a voltage sensing circuit coupled to the auxiliary side winding, the voltage sensing circuit configured to measure an input voltage at an isolated circuit associated with the auxiliary winding. The linear isolated power supply circuit further includes a processor configured to receive the measured input voltage from the voltage sensing circuit and to cause at least one operation to be performed by the processor based at least in part upon the measured input voltage.

The linear isolated power supply circuit includes a first configuration having (i) a first resistor coupled between the auxiliary side winding and both of an attenuating capacitor and an anode of a rectifying diode, (ii) a low pass filter coupled to the cathode of the rectifying diode, and (iii) an output resistor having a first end and a second end, the first end coupled to the low pass filter. The second end of the output resistor in the first configuration may be coupled to ground.

The linear isolated power supply circuit may include a second configuration having (i) a first resistor coupled between the auxiliary side winding and both of an attenuating capacitor and a cathode of a rectifying diode, (ii) a low pass filter coupled to the anode of the rectifying diode, and (iii) an output resistor having a first end and a second end, the first end coupled to the low pass filter. The second end of the output resistor in the second configuration is coupled to a voltage source, such as a constant 5V source.

The at least one operation performed by the processor may be an input voltage peak detection operation and/or an input voltage minimum detection operation. The processor may be configured to calculate at least one of an input power received by the auxiliary side winding and an efficiency of the linear isolated power supply circuit.

Another aspect of the systems and methods disclosed herein includes a method of providing input voltage sensing for boost power factor correction in isolated power supplies for a light emitting diode (LED) driver having a boost converter with a boost inductor winding and a secondary winding. The method includes first receiving an input power signal at the boost inductor winding. A representation of the input power signal is then provided to an isolated circuit of the LED driver circuit via the secondary winding. An input voltage of the isolated circuit is then sensed at the auxiliary winding. The sensed input voltage is received at a processor. At least one operation is performed by the processor based at least in part upon the sensed input voltage.

The method may further include rectifying the input voltage received at the isolated circuit and performing a low pass filtering operation on the rectified input voltage. The at least one operation performed by the processor may be implemented, at least in part, using the low pass filtered rectified input voltage. The low pass filtered rectified input voltage may be offset prior to receiving the sensed input voltage at the processor, for example by 5V.

The at least one operation performed by the processor may include at least one of an input voltage peak detection operation and an input voltage minimum detection operation. At least one of an input power received at the auxiliary side winding and an efficiency of the isolated circuit may be calculated (e.g., using the processor).

An input voltage of the LED driver may be detected during an LED driver startup period when an input boost converter stage associated with the boost inductor winding goes into burst mode. In various embodiments, if the LED driver is driving a load that will cause the boost inductor to run in burst mode in steady state, the input voltage may still be detected during startup, while the boost voltage is initially being developed.

A further aspect of the present invention relates to an LED driver structure. The LED driver includes an input boost converter stage comprising a boost inductor winding and an isolated power supply circuit having (i) an auxiliary winding, the auxiliary winding configured to be magnetically coupled to the boost inductor winding, and (ii) a voltage sensing circuit coupled to the auxiliary winding and configured to measure an input voltage at an isolated circuit associated with the auxiliary winding. The LED driver further includes a processor configured to receive the measured input voltage from the voltage sensing circuit and to cause at least one operation to be performed by the processor based at least in part upon the measured input voltage. The isolated power supply circuit may be a linear isolated power supply circuit as defined herein.

In a first configuration, the voltage sensing circuit may include (i) a first resistor coupled between the auxiliary winding and both of an attenuating capacitor and an anode of a rectifying diode, (ii) a low pass filter coupled to the cathode of the rectifying diode, and (iii) an output resistor having a first end and a second end, the first end coupled to the low pass filter. The second end of the output resistor may be coupled to ground in the first configuration.

In a second configuration, the voltage sensing circuit may include (i) a first resistor coupled between the auxiliary winding and both of an attenuating capacitor and a cathode of a rectifying diode, (ii) a low pass filter coupled to the anode of the rectifying diode, and (iii) an output resistor having a first end and a second end, the first end coupled to the low pass filter. The second end of the output resistor may be coupled to a voltage source in the second configuration. The voltage source may be a constant 5V source.

The at least one operation performed by the processor may be at least one of an input voltage peak detection operation and/or an input voltage minimum detection operation.

The processor may be configured to calculate at least one of an input power received at the auxiliary winding and an efficiency of the isolated power supply circuit.

Implementations consistent with various embodiments of the present invention may not have synchronization requirements like those of the above-described flyback topology. Rather, implementations consistent with the present invention might only require that an element using the sensed signal be able to detect a peak or minimum voltage.

Numerous other objects, features, and advantages of the present invention will be readily apparent to those skilled in the art upon a reading of the following disclosure when taken in conjunction with the accompanying drawings.

DETAILED DESCRIPTION OF THE INVENTION

Figure 1:
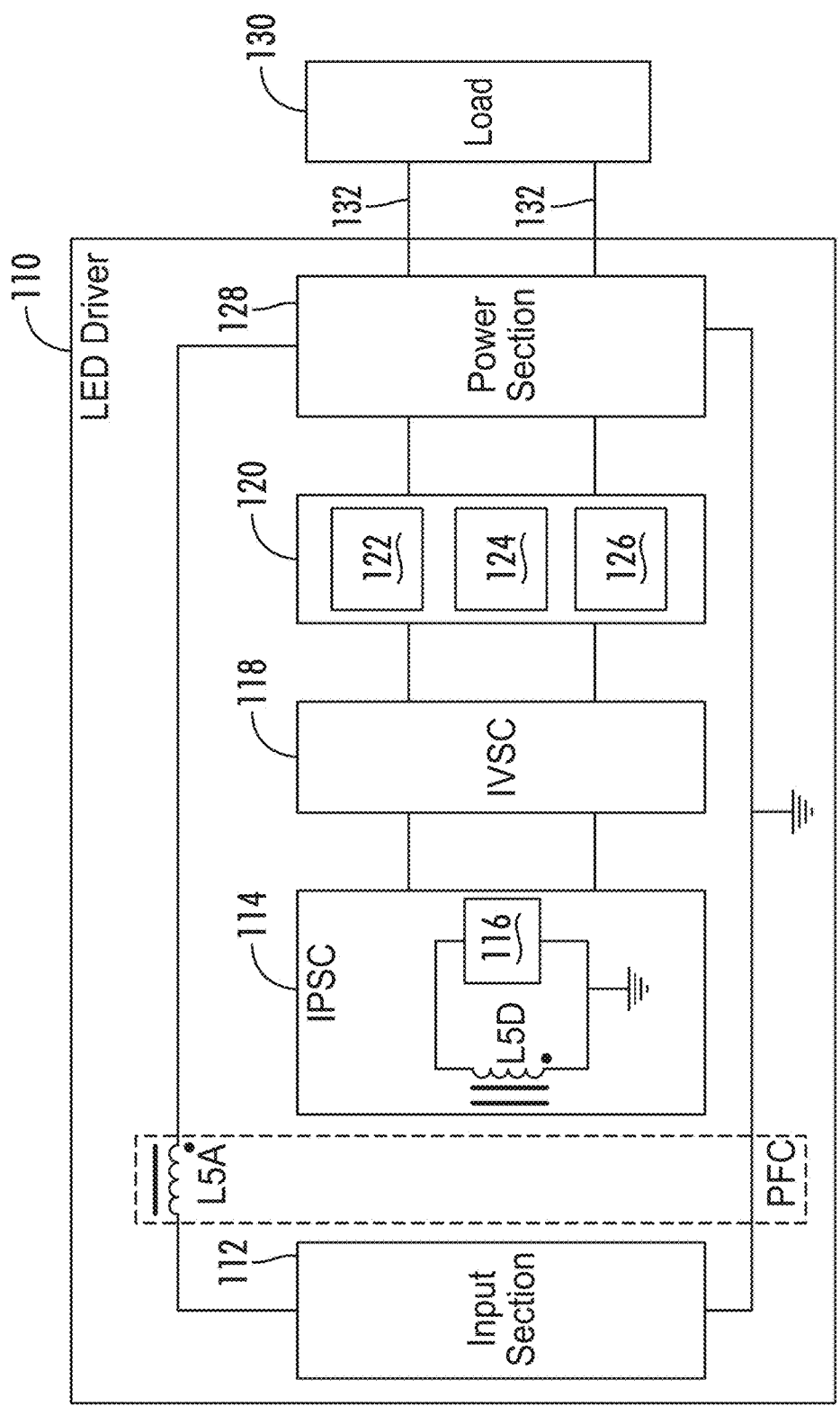
FIG. 1 illustrates an exemplary embodiment of a light emitting diode (LED) having an existing secondary power supply circuit and a first configuration of an input voltage sensing circuit according to aspects of the present invention.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

Referring generally to FIGS. 1-18, exemplary apparatus, systems, and methods for providing an isolated power supply circuit for a light emitting diode (LED) driver are now illustrated in greater detail. Where the various figures may describe embodiments sharing various common elements and features with other embodiments, similar elements and features are given the same reference numerals and redundant description thereof may be omitted below.

Various exemplary embodiments of the present invention may be used to condition a signal from an auxiliary winding of a power factor correction (PFC) boost inductor (e.g., used to generate isolated power supplies) that contains the magnitude of an alternating current (AC) input voltage. The signal may be conditioned on an isolated secondary side of a converter for various desired uses (e.g., for receipt and use by a processor) that may be configured to perform an operation or cause an operation to be performed based at least in part upon a set of information associated with the signal.

One or more exemplary sensing circuits may be designed to allow the input AC voltage level to be sensed from an existing auxiliary boost inductor winding supplying power to the isolated side of a light emitting diode (LED) driver circuit, with minimal additional components and cost.

Implementations consistent with the present disclosure may be achieved by at least two configurations of the input voltage sensing circuit, depending on the relative polarity (e.g., dot orientation) of the auxiliary winding relative to the main boost inductor winding of the converter.

When used in conjunction with a peak voltage detector for a first configuration of the input voltage sensing circuit, or a minimum detector for a second configuration of the input voltage sensing circuit, the input voltage sensing circuit may be used to detect an AC input voltage magnitude during steady-state operation while the input boost converter stage is not in burst mode.

When used in conjunction with a peak voltage detector for a first configuration of the input voltage sensing circuit, or a minimum detector for a second configuration of the input voltage sensing circuit, the input voltage sensing circuit may be used to detect an input voltage during an LED driver startup period (e.g., when the boost voltage is initially being established), even if the input boost converter stage goes into burst mode (even for light driver output loads), because the boost stage will continuously switch at startup for several line cycles in any load condition, thereby encoding several line cycles of attenuated AC peaks.

By increasing the value of the RC components of the circuit, input voltage sense measurement may instead be a flat direct current (DC) measurement having a value directly related to the input AC voltage for the first configuration of the input voltage sensing circuit or for the second configuration of the input voltage sensing circuit of the circuit. As such, the signal may be easier to work with, but might only be accurate while the boost converter stage is not operating in the burst mode.

Indirect measurement of the input voltage may be utilized by another circuit or device, such as a microcontroller, to perform one or more operations or to cause one or more operations to be performed. Exemplary operations may include computing input power, efficiency, etc., and/or reporting information associated with an operation to an externally connected device (e.g., over a communication interface/medium).

I. First Configuration of Input Voltage Sensing Circuit

FIG. 1 illustrates an LED driver system 100 with an existing secondary power supply circuit and a first configuration of an input voltage sensing circuit according to an exemplary embodiment. The LED driver system 100 includes at least one of an LED driver 110 and a load 130. The LED driver 110 may be electronically coupled to the load 130 via one or more conductive buses 132. The LED driver 110 may include at least one of an input section 112, a boost inductor winding L5A of converter L5, an isolated power supply circuit 114 associated with an auxiliary side winding L5D of the converter L5, an input voltage sensing circuit 118, control section 120 having one or more of a processor 122, a memory 124, and/or a transceiver 126, and a power section 128. At least one of the input section 112, the boost inductor winding L5A, the isolated power supply circuit 114 associated with the auxiliary side winding L5D, the input voltage sensing circuit 118, the control section 120, and the power section 128 may be coupled to at least one other element of the LED driver 110 via at least one conductive bus. In one exemplary embodiment, the boost inductor winding L5A and the auxiliary side winding L5D together form at least a portion of a boost converter of or associated with the LED driver 110. The boost inductor winding L5A may form a part of a power factor correction (PFC) circuit along with one or more additional components in an exemplary embodiment.

As used herein, the term "linear" described with reference to an isolated power supply or to the isolated power supply circuit 118 means a non-flyback circuit topology which does not use a transformer coupled to the mains input or an attenuation network.

The input section 112 may be configured to receive at least one of alternating current (AC) power and direct current (DC) power and signals from an input power source. In various embodiments, the input section 112 may be configured to rectify an input received at the input section 112 and to output the rectified input. An output of the input section 112 may be coupled to the boost inductor winding L5A. The boost inductor winding L5A may be magnetically coupled to the auxiliary side winding L5D of the isolated power supply circuit 114. The isolated power supply circuit 114 may include one or more components 116 (e.g., as described below and illustrated with reference to FIG. 2). Although illustrated as not being included within the isolated power supply circuit 114, it should be appreciated that the boost inductor winding L5A may be included as a part of the isolated power supply circuit 114, the input section 112, or any other component internal or external to the LED driver 110. A voltage at the point BSW may be determined, at least in part, by the input voltage sensing circuit 118. In various exemplary embodiments, the input section 112 of the LED driver 110 is or is coupled to a boost power factor correction (PFC) circuit. One or more isolated power supplies may be implemented via one or more secondary windings L5D. Each of the one or more isolated power supplies for the second stage may be developed from an auxiliary winding.

The isolated power supply circuit 114 may be coupled to the input voltage sensing circuit 118 via at least one conductive bus. The input voltage sensing circuit 118 may include one or more components configured to sense an input voltage associated with the auxiliary side winding L5D of the isolated power supply circuit (e.g., at the point BSW). The one or more components of the input voltage sensing circuit 118 are described below and are illustrated with reference to FIG. 3. The isolated power supply circuit 114 may be configured to communicate one or more signals to at least one of the processor 122 and the memory 124 via at least one conductive bus. For example, in one embodiment, the input voltage sensing circuit 118 is configured to transmit at least one voltage sense signal associated with the auxiliary side winding L5D to the processor 122 and/or to the memory 124. The memory 124 may include at least one of a RAM memory, a flash memory, a ROM memory, an EPROM memory, an EEPROM memory, one or more registers, a hard disk, a removable disk, a CD-ROM, or any other form of computer-readable medium known in the art. In one exemplary embodiment, the memory 124 may be a part of the processor 122, or may be communicatively coupled thereto, for example via at least one conductive bus. The memory 124 may be configured to store one or more sets of data, information, and/or operation commands associated with the processor 122 for permitting the processor 122 to perform one or more operations consistent with the present invention.

The processor 122 may be coupled to the power section 128 via at least one conductive bus. The power section 128 may be configured to transmit at least one of power and/or commands via at least one output bus 132. In one exemplary embodiment, the power section 128 may be configured to output power to a load 130.

The control section 120 may include a transceiver 126. The transceiver 126 may include at least one of wired and/or wireless communications hardware configured to communicate via one or more communications protocols. For example, in one embodiment, the transceiver 126 may include a wireless transceiver configured to send and/or receive wireless signals via a radio frequency (RF) or Bluetooth wireless communication protocol. Additionally or alternatively, the transceiver 126 may include a wired communication interface, such as an Ethernet cable port, configured to enable at least one of sending and receiving communication signals.

In one embodiment, the LED driver 110 is configured to receive an AC input signal at the input section 112, to sense an auxiliary side input voltage indirectly measured at the isolated power supply circuit 114, and to perform one or more operations using the processor 122 based at least in part upon the sensed auxiliary side input voltage. The processor 122 may be configured to perform one or more operations using the sensed voltage data including, for example, computing input power and/or efficiency, or performing any other operation on the sensed voltage data. The processor 122 may be configured to transmit one or more sets of information (such as information corresponding to the one or more operations associated with the sensed voltage data) via the transceiver. The transmitted one or more sets of information may be transmitted to an external device in one exemplary embodiment.

Figure 2:
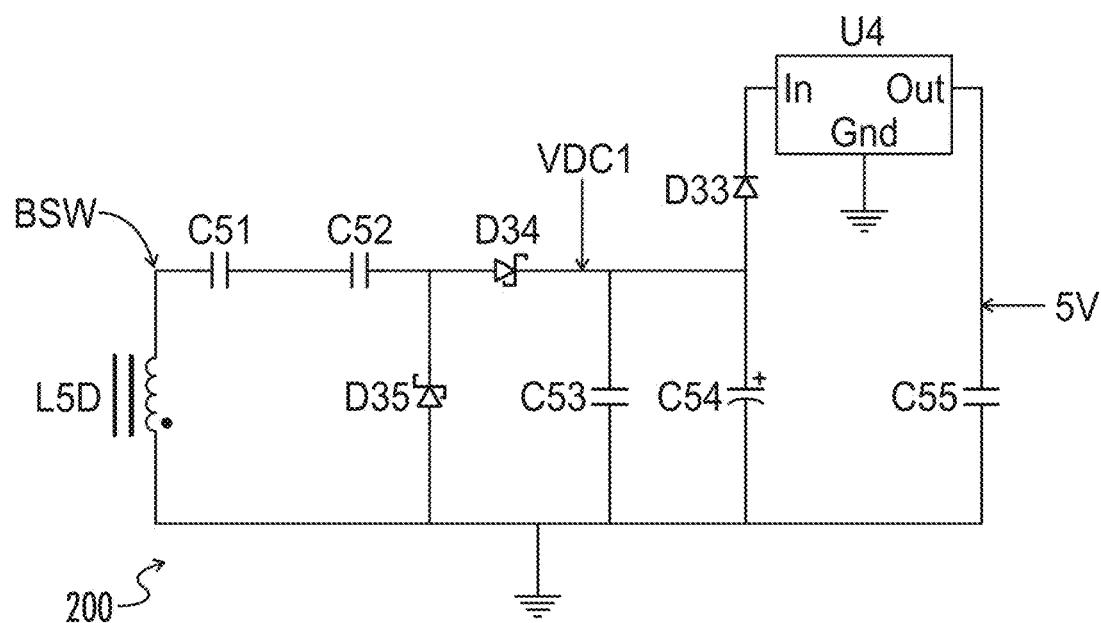
FIG. 2 illustrates an exemplary embodiment of an isolated power supply circuit according to aspects of the present invention.

FIG. 2 illustrates an isolated power supply circuit 200 according to an exemplary embodiment. The power supply circuit 200 may be equivalent to the isolated power supply circuit 114 previously described herein. The power supply circuit 200 includes an auxiliary side winding L5D. The auxiliary side winding L5D is coupled to a first side of a capacitor C51. A signal BSW may be measured at a point between the auxiliary side winding L5D and the capacitor C51, for example using the input voltage sensing circuit 118. A second side of the capacitor C51 may be coupled to a first side of a capacitor C52. A second side of the capacitor C52 may be coupled to a first side of a diode D34 and a first side of a diode D35. In one exemplary embodiment, each of the diodes D34 and D35 are Schottky diodes (e.g., 40V, 1 A Schottky diodes in one embodiment). A DC voltage VDC1 may be measured at an output of the diode D34. An input side of a capacitor C53, an input side of a capacitor C54, and an input side of a diode D33 may be coupled to a second side of the diode D34. A second side of the diode D35, a second side of the capacitor C53, and a second side of the capacitor C54 may be coupled to ground. An output of the diode D33 may be coupled to a controller U4. The controller U4 may be configured to receive the output from the diode D33 and to output a 5V signal coupled to a first side of a capacitor C55. A second side the capacitor C55 may be coupled to ground.

Figure 3:
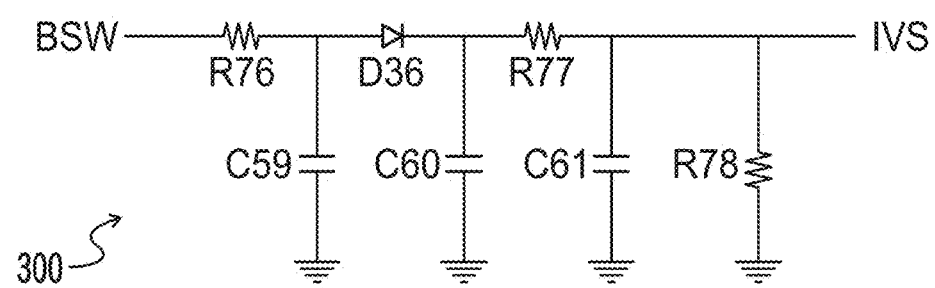
FIG. 3 illustrates a first configuration of an input voltage sensing circuit according to aspects of the present invention.

FIG. 3 illustrates a first configuration 300 of the input voltage sensing circuit 118. The first configuration 300 is configured to be coupled between the isolated power supply circuit 114 and the processor 122. In one exemplary embodiment, the first configuration 300 is configured to sense the BSW voltage measured between the auxiliary side winding L5D and the capacitor C51. The BSW signal is received at a first side of resistor R76. The second side of the resistor R76 is coupled to a first side of a capacitor C59 and to a first side of a diode D36. The second side of the capacitor C59 is coupled to ground. The second side of the diode D36 is coupled to a first side of a capacitor C60 and to a first side of a resistor R77. The second side of the capacitor C60 is coupled to ground. The second side of the resistor R77 is coupled to a first side of a capacitor C61 and to a first side of a resistor R78. The second side of the capacitor C61 and the second side of the resistor R78 are coupled to ground. An input voltage sense signal IVS is coupled to the second side of the resistor R77, to the first side of the capacitor C61, and to the first side of the resistor R78. The input voltage sense signal IVS may be configured to be received at an input of the processor 122. The processor 122 may be configured to perform one or more operations based at least in part upon the received input voltage sense signal IVS as described herein.

In various exemplary embodiments, the resistor R76 may be configured to limit the current into the diode D36, and the capacitor C59 may slightly attenuate the waveform before the diode D36. The diode D36 may be configured to clock the negative portion of the switching waveform (which may be configured to not contain peak input voltage information). The combination of the capacitor C60, the resistor R77, and the capacitor C61 may serve as a low pass filter in one embodiment to attenuate the high frequency switching component of the waveform. The resistance values of the resistors R77 and R78 may be selected such that the input sense voltage IVS is usable by the processor 122. In one exemplary embodiment, the values of the resistors R77 and R78 may be selected such that the input sense voltage IVS does not exceed 5V over normal operating conditions.

The first configuration 300 of the input voltage sensing circuit 118 illustrated by FIG. 3 may be configured to condition the BSW signal into a form usable by another circuit (e.g., the processor 122) for sensing an actual magnitude of the AC input voltage. To achieve this goal, the following may be true of the output of the first configuration 300 of the input voltage sensing circuit 118:

1. The negative portion of the BSW signal may be removed.

2. The magnitude of the BSW signal may be attenuated to not exceed the operating range of the circuit using the signal (5V).

3. The high frequency switching components may be largely filtered out to reduce the burden on the circuit receiving the BSW signal.

4. The AC envelope (as discussed below) may be preserved at least at startup such that there is a significant separation between the peak voltage at one input voltage versus another input voltage for all output loading conditions of the LED driver 110.

5. The sensed peak voltage at a given input voltage must not vary greatly based on output loading conditions, so that a sensed peak at one input voltage/loading condition cannot be confused with the peak for a different input voltage/loading condition.

6. The input voltage sensing circuit 118 may be configured in various exemplary embodiments so as not add significant cost to the overall product. For example, repurposing the signal created on the auxiliary winding of the boost inductor to create a power supply on the isolated output side largely attributes to this minimal component cost.

For the first configuration 300 of the input voltage sensing circuit 118, the voltage at signal BSW is a high frequency switching waveform. During switching, the peak voltage at BSW is approximately the rectified mains voltage attenuated by the ratio of the number of turns of L5D (e.g., 6 turns in one exemplary embodiment) divided by the number of turns of L5A (e.g., 140 turns in one exemplary embodiment). As such, the actual AC rectified mains input voltage information is encoded as the envelope of the positive portion of the voltage waveform at signal BSW during boost inductor switch Q3's on time, so that, for 120 VAC input voltage as an example:

$$V\_BSWpk \approx (Vinpk)*(Ns/Np) \approx (120\sqrt{2})*(6/140) \approx 7.3 \text{ V} \quad \text{(Eq. 1)}$$

Figure 4:
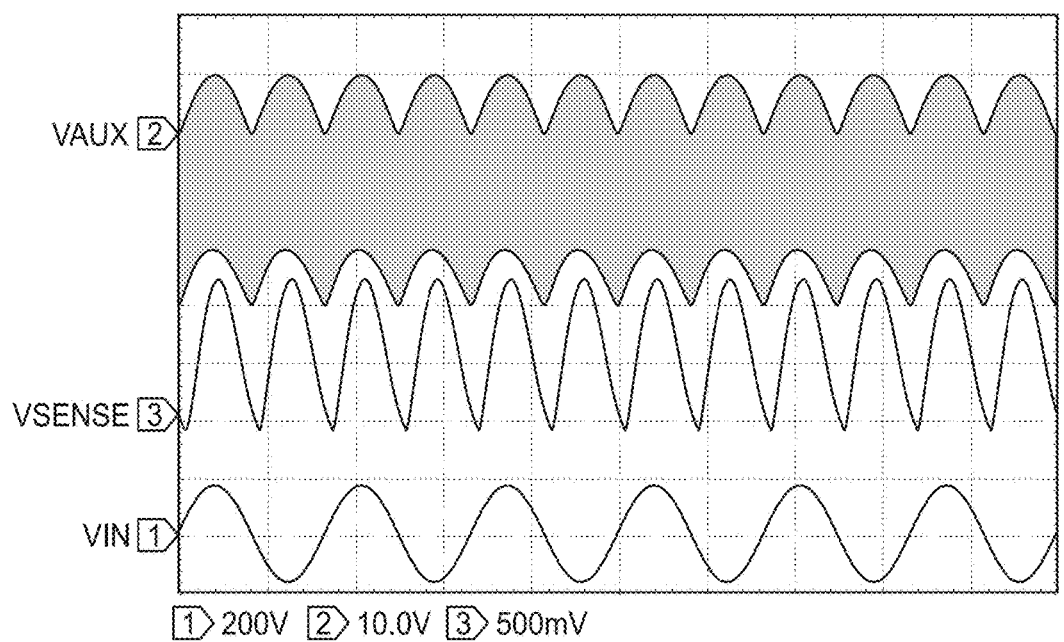
FIG. 4 illustrates an actual sense voltage, V_IVS corresponding to an output IVS of the input voltage sensing circuit provided by of FIG. 3, according to aspects of the present invention.

FIG. 4 illustrates that the Eq. 1 calculation is close to the actual signal as measured on an LED driver 110. As noted above, FIG. 3 shows the detail of the first configuration 300 of the input voltage sensing circuit 118. Specifically, the resistor R76 limits the current into the diode D36, and the capacitor C59 slightly attenuates the waveform before diode D36. Diode D36 blocks the negative portion of the switching waveform (which does not contain peak input voltage information), and the combination of the capacitor C60, the resistor R77 and the capacitor C61 serve as a low pass filter to attenuate the high frequency switching component of the waveform. The resistance values of the resistor R77 and the resistor R78 may be selected such that the input sense voltage IVS is usable by the processor 122 in this case, but does not exceed 5V over normal operating conditions.

Figure 5A:
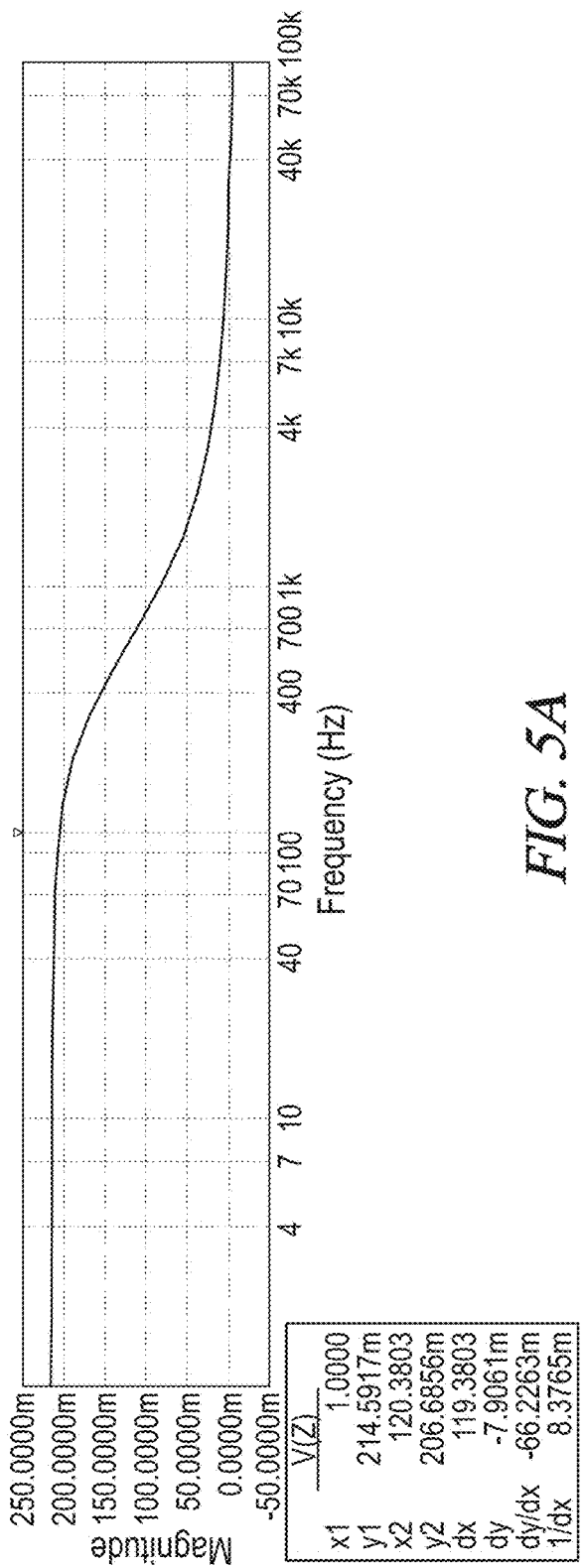
FIGS. 5A and 5B respectively provide graphical alternating current (AC) analysis of a simplified version of the first configuration of the input voltage sensing circuit illustrated by FIG. 6, according to aspects of the present invention.
Figure 5B:
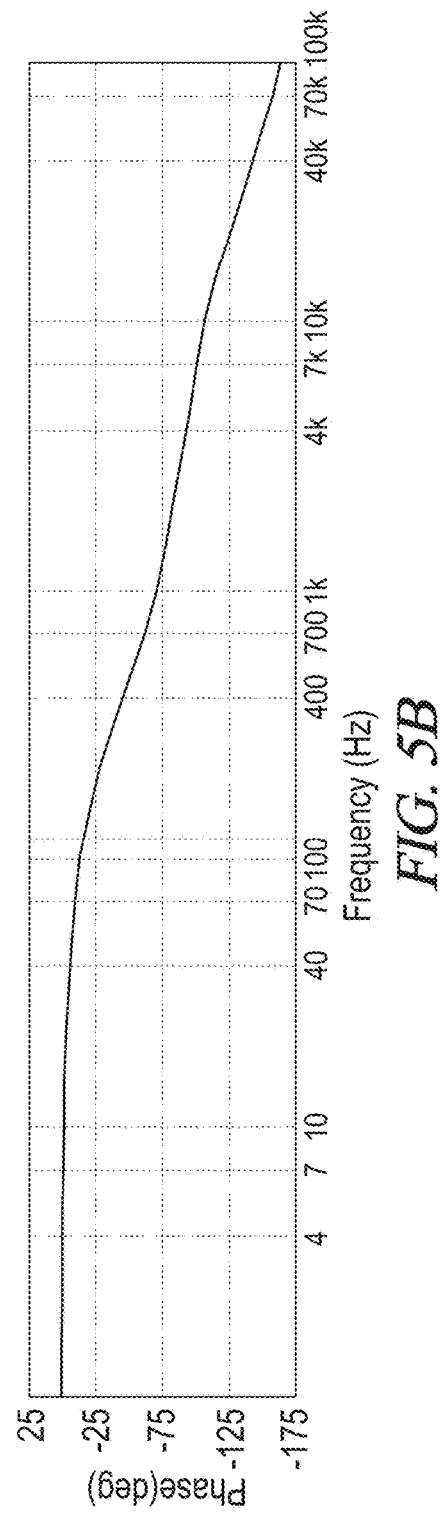
Figure 6:
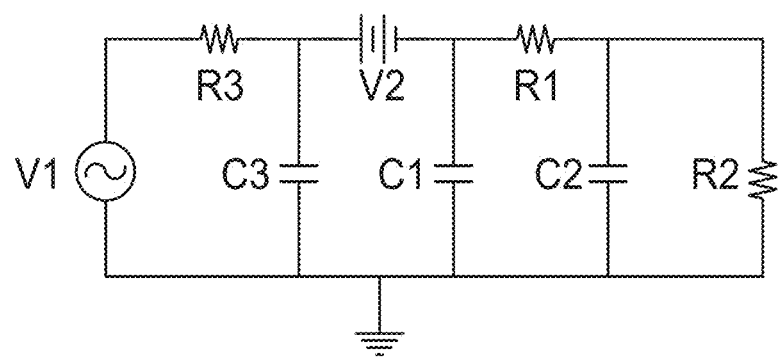
FIG. 6 illustrates a simplified input voltage sensing circuit according to aspects of the present invention.

FIGS. 5A and 5B provide graphical AC analysis of a simplified version of the first configuration 300 of the input voltage sensing circuit 118 as illustrated by FIG. 6. FIG. 5A provides a graph showing the relationship between frequency (in Hz) and magnitude while FIG. 5B illustrates the relationship between frequency (in Hz) and phase (in degrees). As illustrated by FIGS. 5A and 5B, at 120 Hz, the signal has an attenuation factor of about 0.207. The VSENSE trace of FIG. 4 illustrates the actual sense voltage, V_IVS, which corresponds to the output IVS of the input voltage sensing circuit 118 illustrated by of FIG. 3. The voltage V_IVS has a peak of 1.73V in FIG. 4, similar to the expected value of (7.3V)*0.207=1.51V.

FIG. 6 illustrates a simplified input voltage sensing circuit 600 according to an exemplary embodiment. The simplified input voltage sensing circuit 600 includes an input AC voltage source V1 coupled to a resistor R3. In one exemplary embodiment, the resistor R3 may have a resistance value of 100 ohms. The resistor R3 is coupled to a capacitor C3 (e.g., having a capacitance of 1 nF) and to a voltage source V2 (e.g., having an output of 0.7V). The voltage source V2 is coupled to a capacitor C1 and to a resistor R1. The capacitor C1 may have a capacitance of 47 nF and the resistor R1 may have a resistance of 36.5 kiloohms in one exemplary embodiment. The resistor R1 is coupled to a capacitor C2 and to a resistor R2, where the capacitor C2 and the resistor R2 are arranged in a parallel configuration. The capacitor C2 may have a capacitance of 47 nF and the resistor R2 may have a resistance of 10 kilohms in an exemplary embodiment. Each of the input AC voltage source V1, the capacitors C1, C2, and C3, and the resistor R2 are coupled to ground. As noted above, each of FIGS. 5A and 5B correspond to an AC analysis of the simplified input voltage sensing circuit 600.

Figure 7:
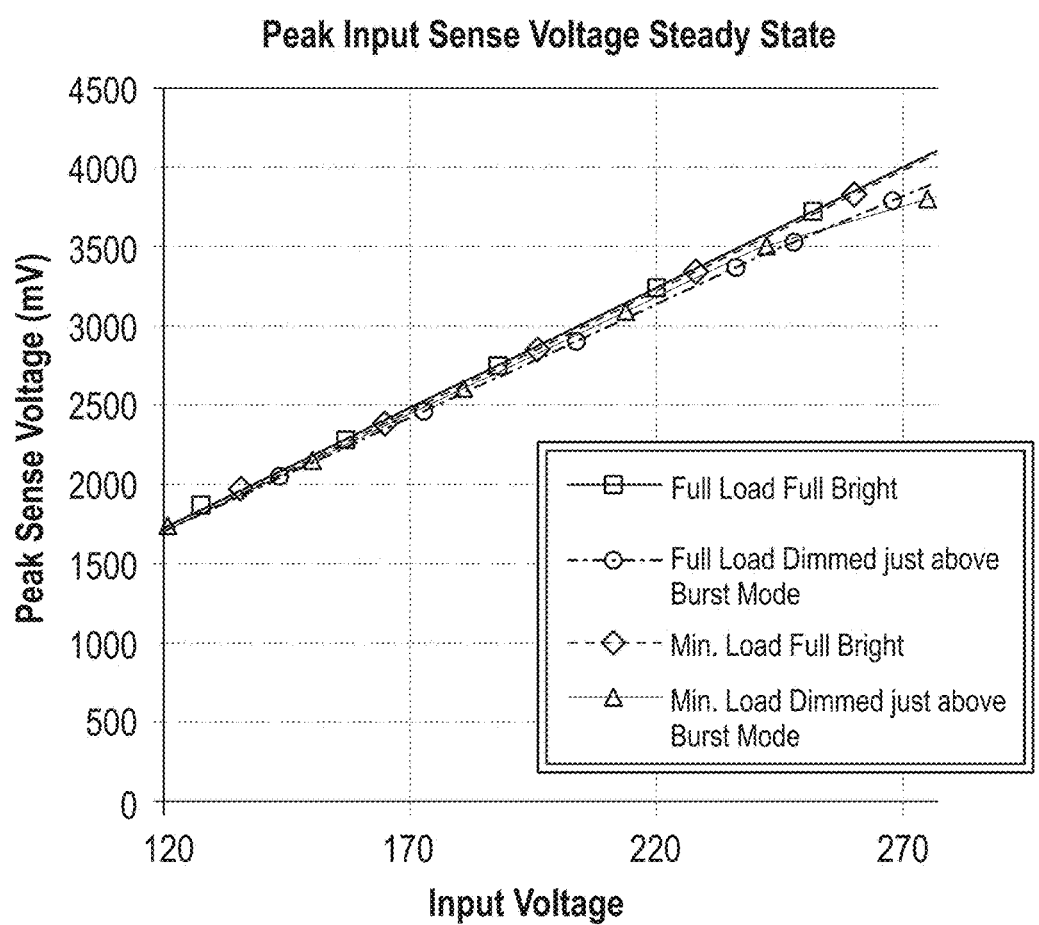
FIG. 7 illustrates a peak input sense voltage (V_IVS) relative to a maximum input voltage for 'full load' conditions, and lesser output load conditions leading up to the condition where the boost power factor correction (PFC) goes into burst mode, according to aspects of the present invention.

FIG. 7 illustrates the peak input sense voltage (V_IVS) relative to a maximum input voltage for 'full load' conditions, and lesser output load conditions leading up to the condition where the boost PFC goes into burst mode. If the PFC is guaranteed not to go into burst mode, then this solution is sufficient, and the input to voltage sensing circuit 118 can be augmented to hold a flat DC value for easier use by the circuit that uses the signal.

However, in this case, the boost PFC can go into burst mode in light load conditions, which means the input sense voltage circuit 118 cannot be guaranteed to have the magnitude of the AC input voltage encoded in its signal. In this case, the boost PFC is at least guaranteed to switch for several input voltage line cycles to initially develop the voltage Vrail, so the input voltage information can at least be obtained at startup.

Figure 8:
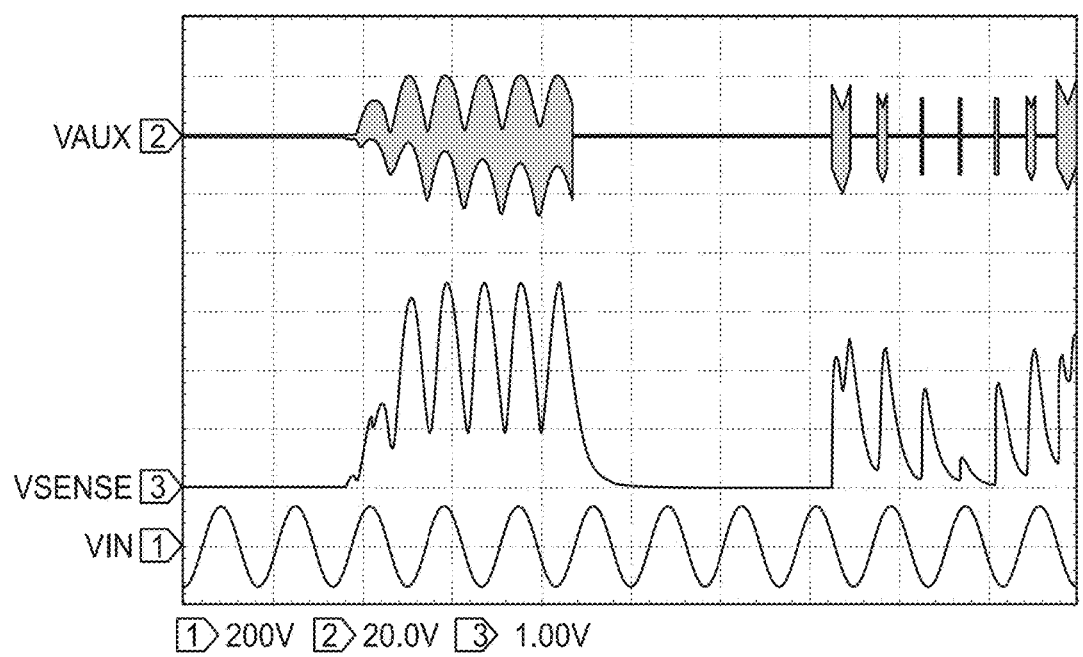
FIG. 8 illustrates an example of the boost PFC going into burst mode, according to aspects of the present invention.

FIG. 8 illustrates an example of the boost PFC going into burst mode. The voltage V_BSW (illustrated as VAUX) shows the boost PFC stopping switching, and the sense voltage VSENSE no longer being guaranteed to encode the magnitude of the input voltage.

Figure 9:
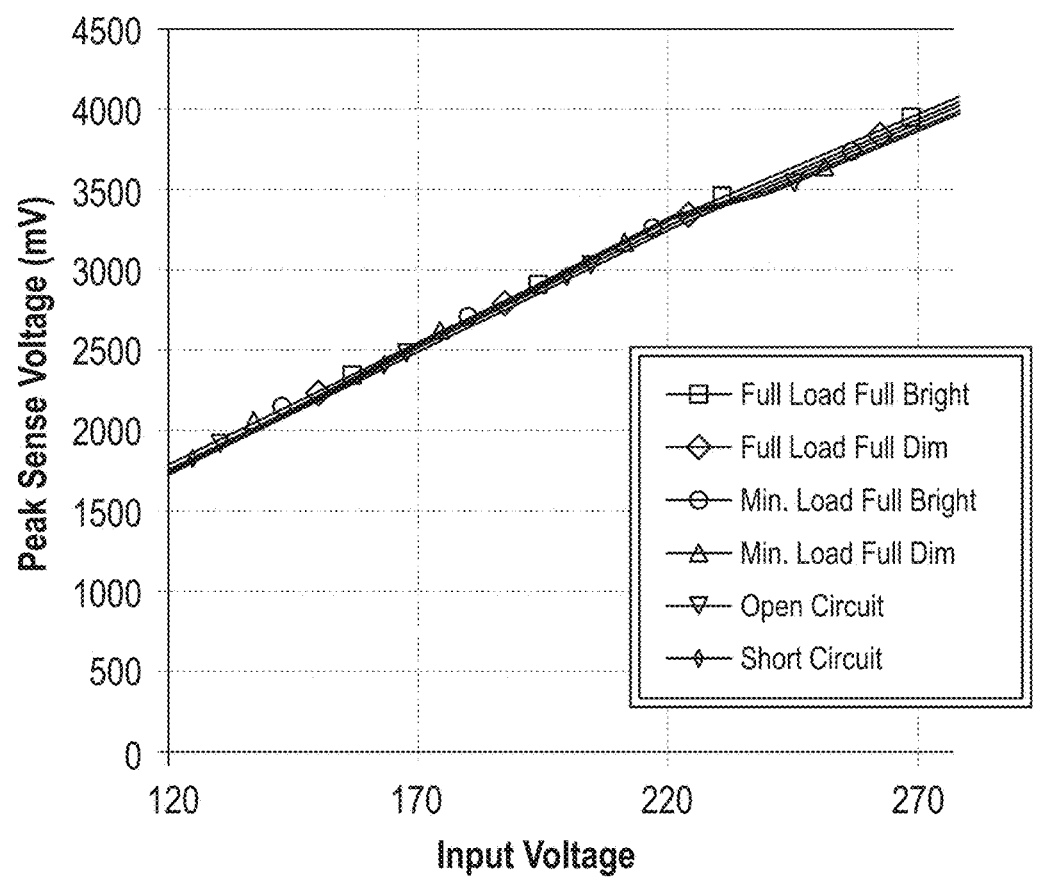
FIG. 9 illustrates a peak input sense voltage measurement of the voltage V_IVS (in mV) versus the AC input voltage (in V) for a full load full bright condition, a full load full dim condition, a minimum load full bright condition, a minimum load full dim condition, an open circuit condition, and a short circuit condition, according to aspects of the present invention.

FIG. 9 illustrates a peak input sense voltage measurement of the voltage V_IVS (in mV) vs. the AC input voltage (in V) for a full load full bright condition, a full load full dim condition, a minimum load full bright condition, a minimum load full dim condition, an open circuit condition, and a short circuit condition. FIG. 9 corresponds to tabulated peak input voltage information for the voltage V_IVS at startup.

Figure 10:
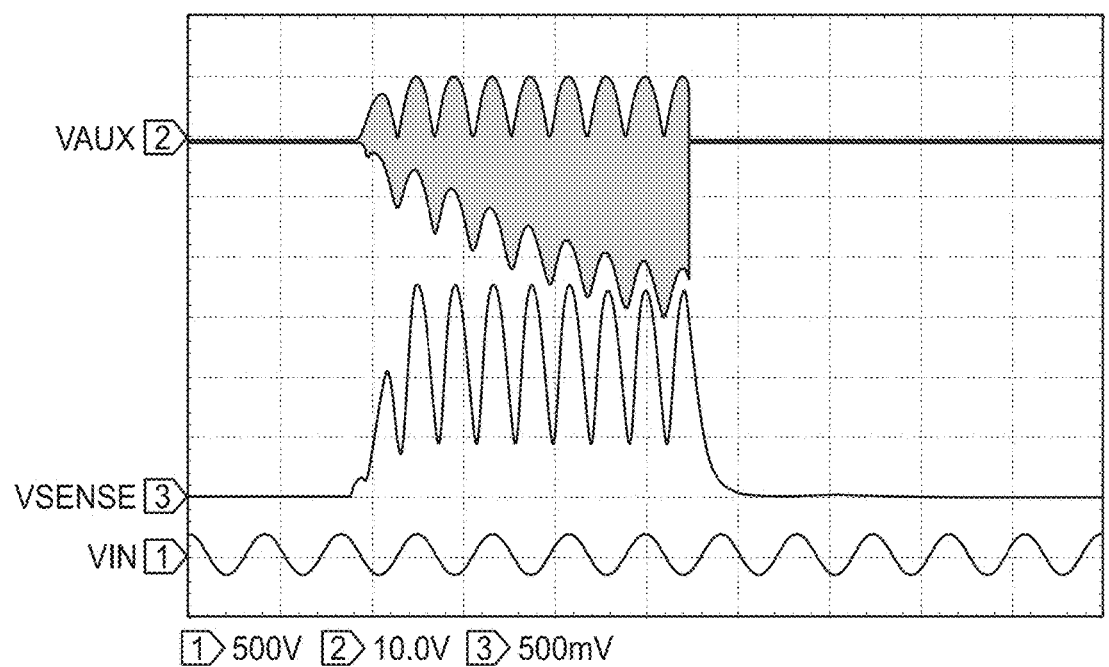
FIG. 10 illustrates an exemplary waveform of the voltages V_BSW (illustrated as VAUX) and V_IVS (illustrated as VSENSE) to show voltage sensing at startup, according to aspects of the present invention.
Figure 11:
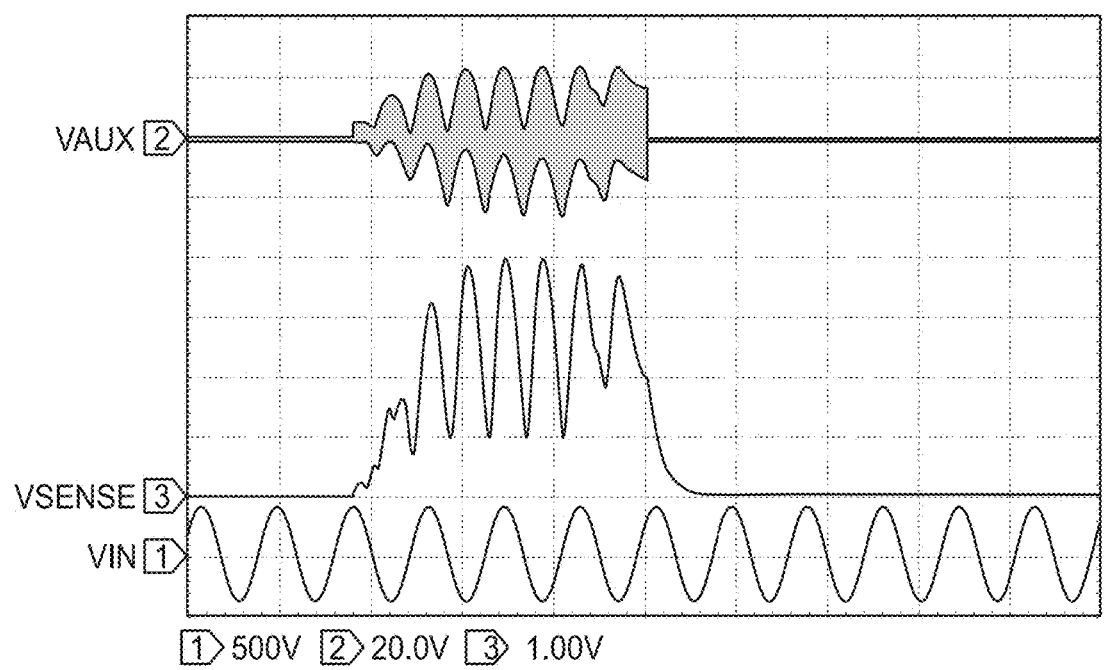
FIG. 11 illustrates additional exemplary waveforms of the voltages V_BSW (illustrated as VAUX) and V_IVS (illustrated as VSENSE) to show voltage sensing at startup, according to aspects of the present invention.
Figure 12:
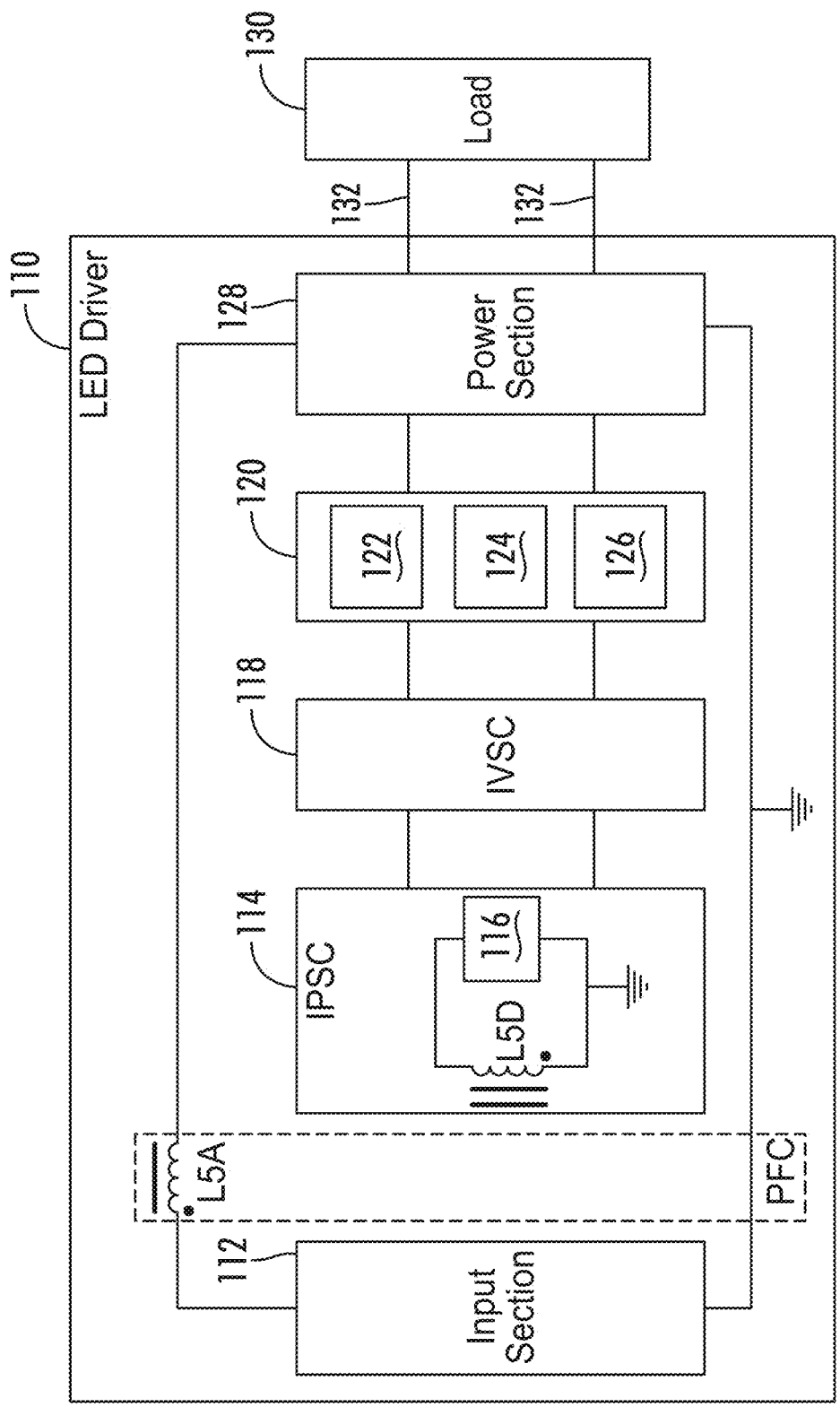
FIG. 12 illustrates a reversed polarity embodiment of the second configuration, according to aspects of the present invention.

FIGS. 10 and 11 respectively illustrate exemplary waveforms of the voltages V_BSW (illustrated as VAUX) and V_IVS (illustrated as VSENSE) at startup to show that the input voltage can, in fact, be measured at startup while the boost PFC is switching for a few line cycles before overshooting or going into burst mode. As such, one or more operations may be performed by the processor in accordance with the sensed voltage despite the boost PFC entering burst mode shortly after startup.

II. Second Configuration of Input Voltage Sense Circuit

Figure 13:
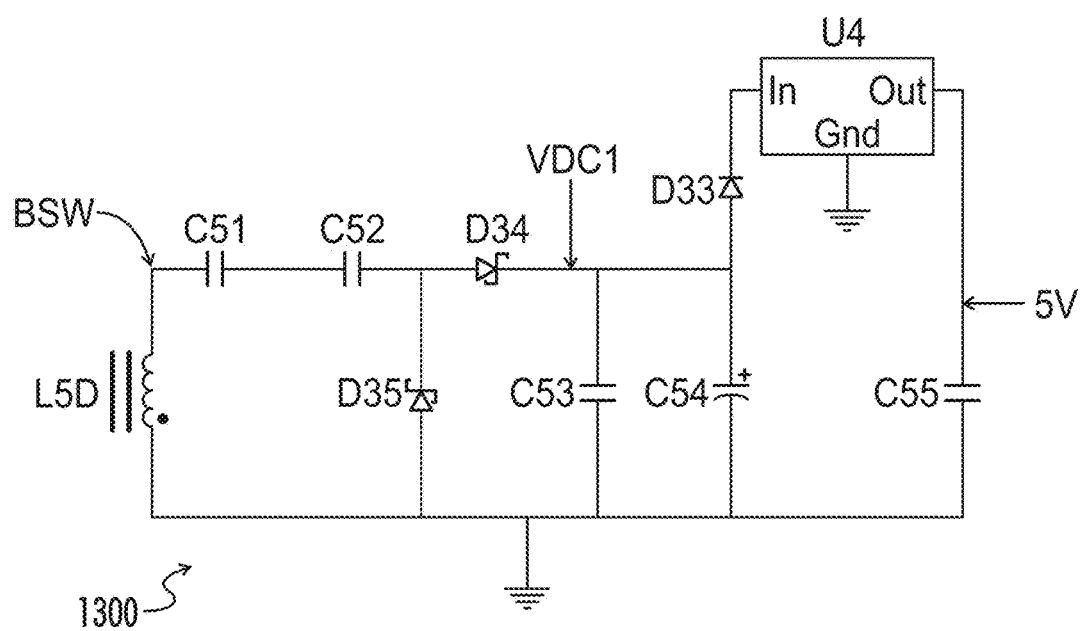
FIG. 13 illustrates an identical polarity orientation for the isolated power supply circuit of the second configuration as that of the isolated power supply circuit illustrated by FIG. 2, according to aspects of the present invention.

The second configuration of the input voltage sensing circuit 118 is very similar to the first configuration 300. A difference between the second configuration of the input voltage sensing circuit 118 and the first configuration 300 relates to use with a boost inductor having the boost inductor winding's polarity orientation reversed with respect to the secondary winding. The reversed polarity configuration 1200 is illustrated in the exemplary embodiment provided by FIG. 12. The input voltage sensing circuit 118 is slightly different because the polarity orientation of the boost inductor winding (L5A) with respect to the auxiliary winding (L5D) is reversed such that the AC input voltage magnitude information is encoded on the negative envelope of the V_BSW waveform. FIG. 13 illustrates the identical polarity orientation for the isolated power supply circuit 1300 of the second configuration as that of the isolated power supply circuit 200 illustrated by FIG. 2.

Figure 14:
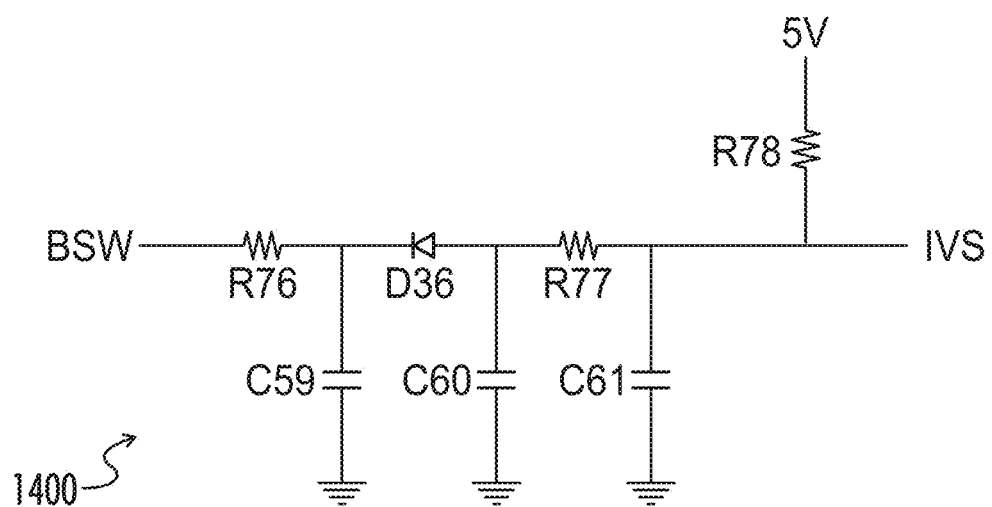
FIG. 14 illustrates a second configuration of an input voltage sensing circuit according to aspects of the present invention.

FIG. 14 illustrates a second configuration 1400 of an input voltage sensing circuit 118 according to an exemplary embodiment. The second configuration 1400 is configured to be coupled between the isolated power supply circuit 114 and the processor 122. In one exemplary embodiment, the second configuration 1400 is configured to sense the BSW voltage measured between the auxiliary side winding L5D and the capacitor C51. The BSW signal is received at a first side of resistor R76. The second side of the resistor R76 is coupled to a first side of a capacitor C59 and to a first side of a diode D36. The second side of the capacitor C59 is coupled to ground. The second side of the diode D36 is coupled to a first side of a capacitor C60 and to a first side of a resistor R77. The second side of the capacitor C60 is coupled to ground. The second side of the resistor R77 is coupled to a first side of a capacitor C61 and to a first side of a resistor R78. The second side of the capacitor C61 is coupled to ground. The second side of the resistor R78 is coupled to a 5V input. An input voltage sense signal IVS is coupled to the second side of the resistor R77, to the first side of the capacitor C61, and to the first side of the resistor R78. The input voltage sense signal IVS may be configured to be received at an input of the processor 122. The processor 122 may be configured to perform one or more operations based at least in part upon the received input voltage sense signal IVS as described herein.

Differences in the input voltage sensing circuit 114 for the second configuration 1400 relative to the first configuration 300 include:

1. The diode D36 of the sense circuit is reversed to block the unwanted positive waveform of V_BSW.

2. The resistor R78 is terminated to 5V instead of SGND so that the resulting signal is both attenuated and provided a positive offset such that the voltage V_IVS is positive for all conditions.

The goals of the input voltage sensing circuit 114 for the second configuration 1400 are largely the same as the goals for the first configuration 300, with the exception that the positive portion of the BSW signal is removed instead of the negative portion, and the resulting signal needs to be shifted so that it is a positive value.

The approximate peak of the AC input voltage envelope for the first configuration 300 as described with reference to equation (1) remains the same for the second configuration 1400, except that the AC input voltage envelope is now on the negative portion of the V_BSW waveform, such that equation (1) now becomes:

$$V\_BSWpk \approx (Vinpk)*(Ns/Np) \approx (120\sqrt{2})*(2/40) \approx -8.5\ V \quad \text{(Eq. 2)}$$

Figure 15:
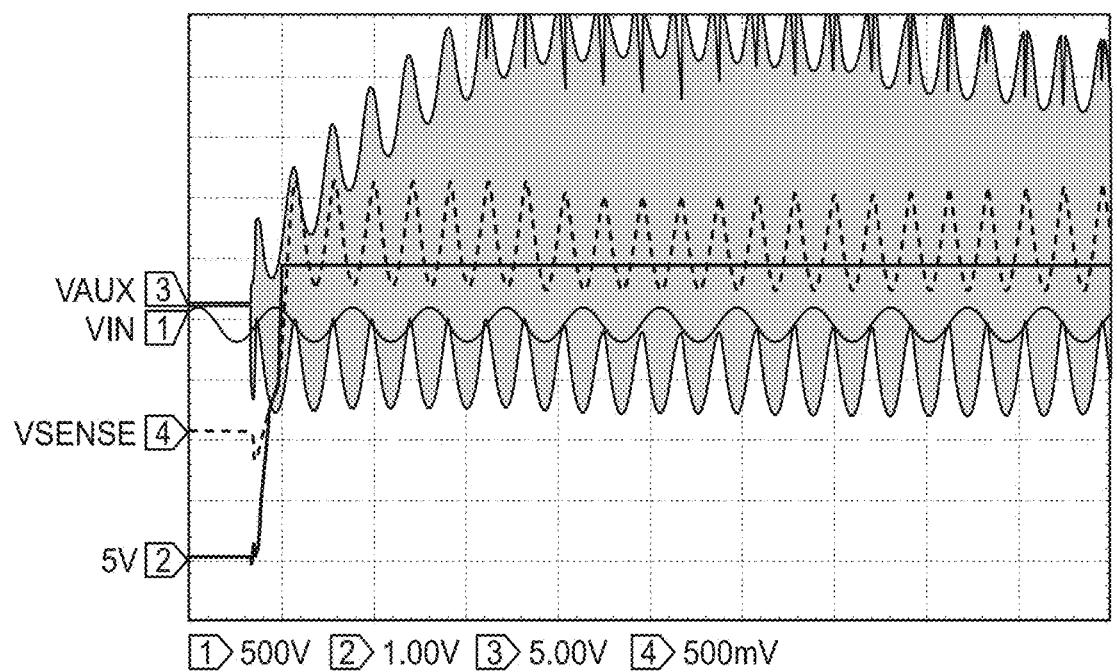
FIG. 15 illustrates a graph reflecting that the calculated boost secondary winding peak voltage value is close to real-world results in an embodiment where the input voltage is encoded in the negative peak, according to aspects of the present invention.

In this particular case, Ns=2, Np=40, so for Vin=120 VAC as an example, V_BSWpk≈−120√2*(2/40)=−8.5V. FIG. 15 provides a graph reflecting that the calculated V_BSWpk value is close to real-world results in an embodiment where the input voltage is encoded in the negative peak. The input voltage sensing circuit 118 for the second configuration 1400 may be configured to then attenuate this negative voltage and to add it to a positive voltage (e.g., 5V attenuated by the combination of the resistors R77 and R78) to give the sensed voltage V_IVS enough of a positive offset such that it is usable by a device on the 5V voltage rail (e.g., the processor in this case).

Figure 16:
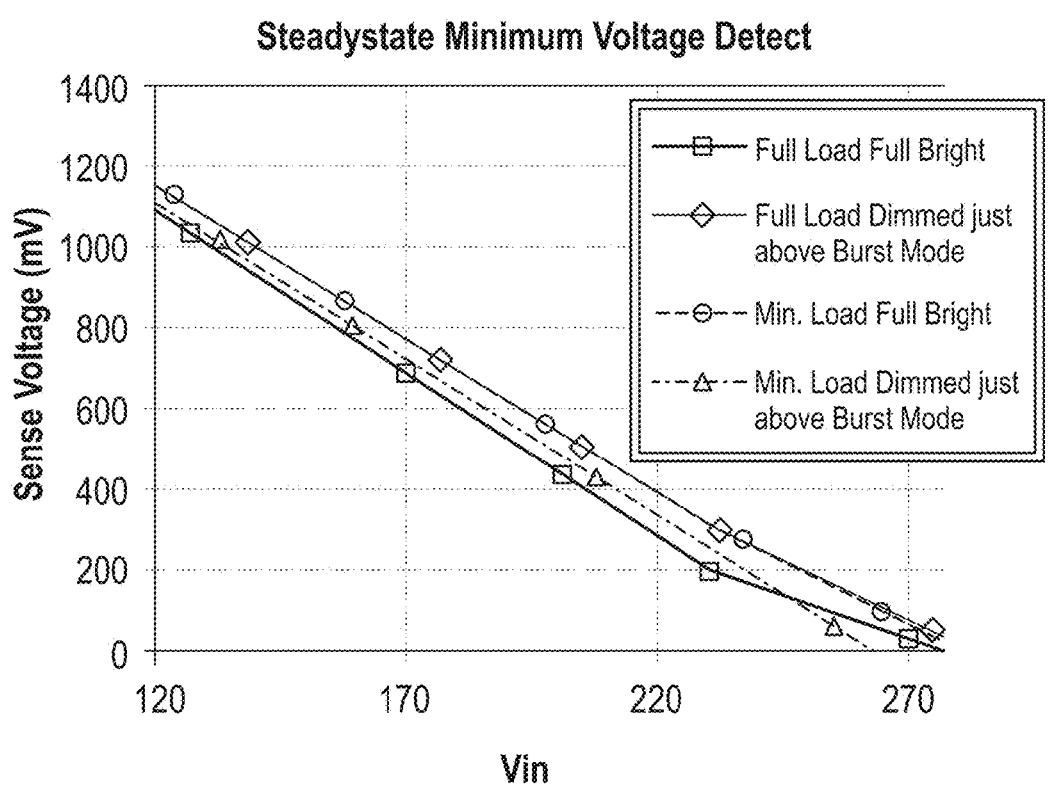
FIG. 16 illustrates a graph reflecting the detected minimum sense voltage V_IVS versus the AC input voltage for full load conditions, and lesser loading conditions leading up the PFC going into burst mode, according to aspects of the present invention.
Figure 17:
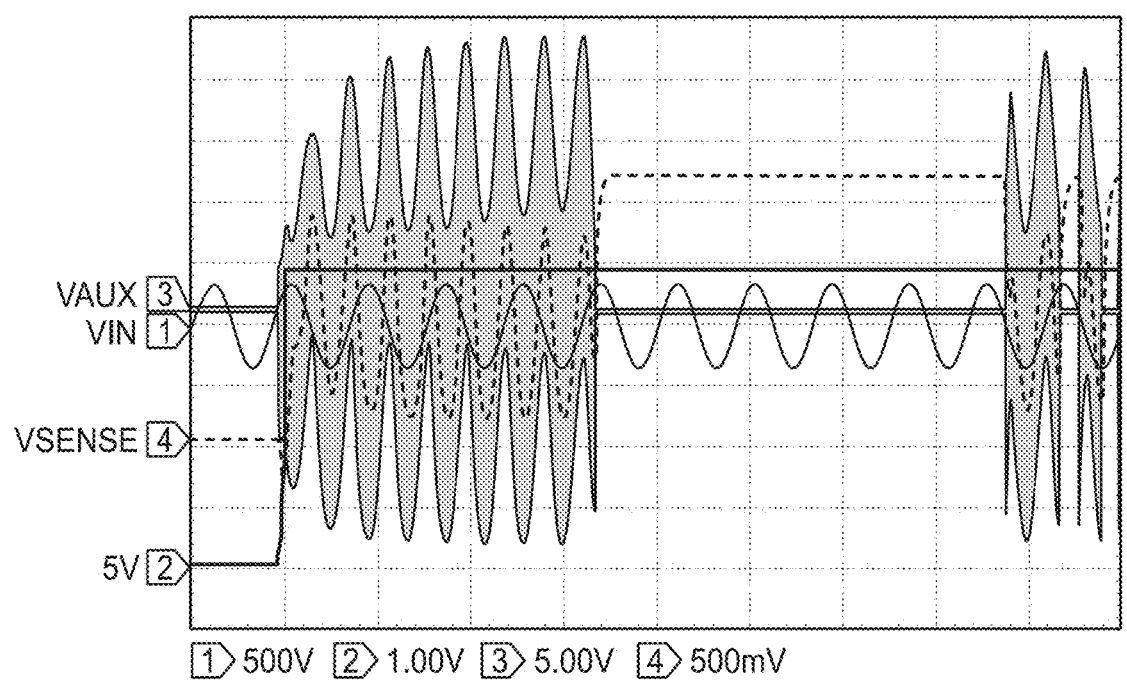
FIG. 17 provides a graph of obtained input voltage information using the second configuration of the input voltage sensing circuit at startup when the PFC goes into burst mode, according to aspects of the present invention.
Figure 18:
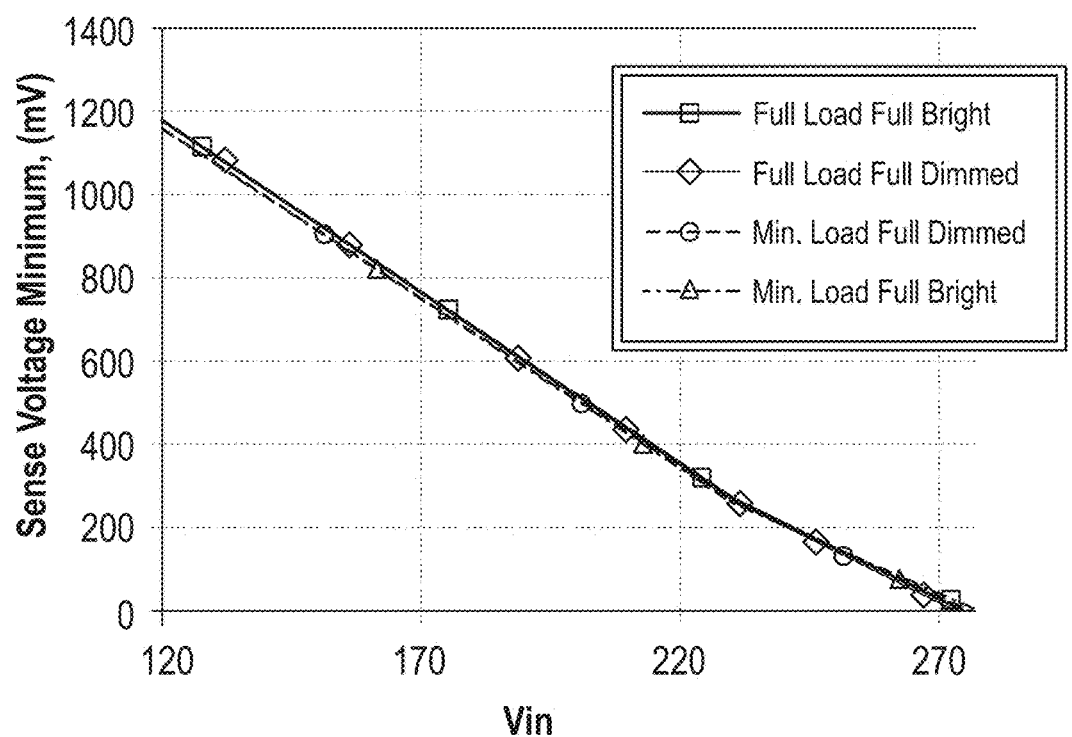
FIG. 18 provides a graph of a sensed voltage minimum, as measured in millivolts, plotted over a plurality of input voltages Vin, measured in volts, according to aspects of the present invention.

FIG. 16 illustrates a graph reflecting the detected minimum sense voltage V_IVS vs. the AC input voltage for full load conditions, and lesser loading conditions leading up the PFC going into burst mode. Similar to the first configuration 300, the measured input sense voltage has pretty good separation between values for input voltage measurements, and thus, the output loading condition may be largely unimportant. As such, the input voltage magnitude can be deduced irrespective of the output loading condition such that one input voltage measurement and output loading condition may not be confused with another input voltage and output loading condition. Just like with the first configuration 300, the input voltage sensing circuit 118 may be modified such that the V_IVS voltage measurement is a flat DC measurement so long as the PFC is guaranteed not to go into burst mode. If the PFC can go into burst mode, the input voltage magnitude can still be determined during the first few line cycles of switching, while Vrail is being established. This is shown, for example, by FIG. 17, which provides a graph of obtained input voltage information using the second configuration 1400 of the input voltage sensing circuit 118 at startup when the PFC goes into burst mode. The corresponding startup minimum voltage measurement information is plotted vs. a plurality of input voltages in FIG. 18. In FIG. 18, a sensed voltage minimum as measured in millivolts is plotted over a plurality of input voltages Vin measured in volts. The sense voltage minimum values of four load conditions (full load full bright condition, full load full dim condition, minimum load full dim condition, and minimum load full bright condition) are provided across the range of input voltage values Vin.

III. Summary and Benefits of Input Voltage Sensing Circuits

As described above with reference to the first configuration 300 and the second configuration 1400, the input voltage magnitude can be indirectly sensed on the isolated output side of the LED Driver 110 using similar sensing circuit techniques for either polarity orientation of the boost inductor winding to the secondary boost inductor winding. The disclosed input voltage sensing circuits may be configured to add minimal cost and/or to make the measurement for any standard input voltage easily distinguishable from any other standard input voltage with the use of either a peak detector for the first configuration 300, a minimum detector for the second configuration 1400, or some other device capable of producing similar functions (e.g., a processor 122, for instance, configured with built-in comparators or an analog-to-digital converter). This information, when used in conjunction with directly sensed output voltage and current measurements on the isolated output side, can then be used to provide useful functions such as, for example, calculating input power and efficiency and reporting that information to an external device, or providing internal power limiting functionality.

Implementations consistent with the present disclosure may provide various benefits, including enabling use of an existing LED driver signal to detect input voltage, and/or conditioning the signal so that it is useable by other circuitry on the isolated side of the LED driver 110. Furthermore, either or both of these benefits may be obtained with a minimal amount of additional components and cost.

The steps of a method, process, or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of computer-readable medium known in the art. An exemplary computer-readable medium can be coupled to the processor such that the processor can read information from, and write information to, the memory/storage medium. In the alternative, the medium can be integral to the processor.

The processor and the medium can reside in an ASIC. The ASIC can reside in a user terminal. In the alternative, the processor and the medium can reside as discrete components in a user terminal.

To facilitate the understanding of the embodiments described herein, a number of terms are defined below. The terms defined herein have meanings as commonly understood by a person of ordinary skill in the areas relevant to the present invention. Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" may include plural references, and the meaning of "in" may include "in" and "on." The phrase "in one embodiment," as used herein does not necessarily refer to the same embodiment, although it may.

The term "coupled" means at least either a direct electrical or physical connection between the connected items or an indirect connection via one or more passive or active intermediary devices.

The term "circuit" means at least either a single component or a multiplicity of components, either active and/or passive, that are coupled together to provide a desired function.

Terms such as "wire," "wiring," "line," "signal," "conductor," and "bus" may be used to refer to any known structure, construction, arrangement, technique, method and/or process for physically transferring a signal from one point in a circuit to another.

The terms "switching element" and "switch" may be used interchangeably and may refer herein to at least: a variety of transistors as known in the art (including but not limited to FET, BJT, IGBT, IGFET, etc.), a switching diode, a silicon controlled rectifier (SCR), a diode for alternating current (DIAC), a triode for alternating current (TRIAC), a mechanical single pole/double pole switch (SPDT), or electrical, solid state or reed relays. Where either a field effect transistor (FET) or a bipolar junction transistor (BJT) may be employed as an embodiment of a transistor, the scope of the terms "gate," "drain," and "source" includes "base," "collector," and "emitter," respectively, and vice-versa.

The terms "power converter" and "converter" unless otherwise defined with respect to a particular element may be used interchangeably herein and with reference to at least DC-DC, DC-AC, AC-DC, buck, buck-boost, boost, half-bridge, full-bridge, H-bridge or various other forms of power conversion or inversion as known to one of skill in the art.

The terms "processor," "controller," "control circuit" and "control circuitry" as used herein may refer to, be embodied by or otherwise included within a machine, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed and programmed to perform or cause the performance of the functions described herein. A general purpose processor can be a microprocessor, but in the alternative, the processor can be a microcontroller, or state machine, combinations of the same, or the like. A processor can also be implemented as a combination of computing devices, e.g., a combination of a DSP and a processor, a plurality of processors, one or more processors in conjunction with a DSP core, or any other such configuration.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The previous detailed description has been provided for the purposes of illustration and description. Thus, although there have been described particular embodiments of a new and useful invention, it is not intended that such references be construed as limitations upon the scope of this invention except as set forth in the following claims.

What is claimed is:

1. A linear isolated power supply circuit for a light emitting diode (LED) driver, comprising:
   a boost converter having a boost inductor winding;
   a voltage sensing circuit comprising
      a first resistor coupled on a first end to an auxiliary side winding magnetically coupled to the boost inductor winding and on a second end to both of an attenuating capacitor and an anode of a rectifying diode,
      a low pass filter coupled to a cathode of the rectifying diode, and
      an output resistor having a first end and a second end, the first end coupled to the low pass filter,
      the voltage sensing circuit configured to measure an input voltage at an isolated circuit associated with the auxiliary side winding; and
   a processor configured to receive the measured input voltage from the voltage sensing circuit and to cause at least one operation to be performed by the processor based at least in part upon the measured input voltage.

2. The linear isolated power supply circuit of claim 1, wherein the second end of the output resistor is coupled to ground.

3. The linear isolated power supply circuit of claim 1, wherein the at least one operation performed by the processor is an input voltage peak detection operation.

4. The linear isolated power supply circuit of claim 1, wherein the at least one operation performed by the processor is an input voltage minimum detection operation.

5. The linear isolated power supply circuit of claim 1, wherein the processor is configured to calculate at least one of an input power received by the auxiliary side winding and an efficiency of the linear isolated power supply circuit.

6. A light emitting diode (LED) driver, comprising:
   an input boost converter stage comprising a boost inductor winding;
   an isolated power supply circuit having:
      an auxiliary winding magnetically coupled to the boost inductor winding; and
      a voltage sensing circuit comprising
         a first resistor coupled on a first end to the auxiliary winding and on a second end to both of an attenuating capacitor and a first end of a rectifying diode,
         a low pass filter coupled to a second end of the rectifying diode, and
         an output resistor having a first end and a second end, the first end coupled to the low pass filter, the voltage sensing circuit configured to measure an input voltage at an isolated circuit associated with the auxiliary winding; and a processor configured to receive the measured input voltage from the voltage sensing circuit and to cause at least one operation to be performed by the processor based at least in part upon the measured input voltage.

7. The LED driver of claim 6, wherein the isolated power supply circuit is a linear isolated power supply circuit.

8. The LED driver of claim 6, wherein the first end of the rectifying diode is an anode of the rectifying diode, and wherein the second end of the output resistor is coupled to ground.

9. The LED driver of claim 6, wherein the first end of the rectifying diode is a cathode of the rectifying diode, and wherein the second end of the output resistor is coupled to a voltage source.

10. The LED driver of claim 6, wherein the at least one operation performed by the processor is an input voltage peak detection operation.

11. The LED driver of claim 6, wherein the at least one operation performed by the processor is an input voltage minimum detection operation.

12. The LED driver of claim 6, wherein the processor is configured to calculate at least one of an input power received by the auxiliary side winding and an efficiency of the linear isolated power supply circuit.

13. A linear isolated power supply circuit for a light emitting diode (LED) driver, comprising:
a boost converter having a boost inductor winding;
a voltage sensing circuit comprising
a first resistor coupled on a first end to an auxiliary side winding magnetically coupled to the boost inductor winding and on a second end to both of an attenuating capacitor and a cathode of a rectifying diode,
a low pass filter coupled to an anode of the rectifying diode, and
an output resistor having a first end and a second end, the first end coupled to the low pass filter,
the voltage sensing circuit configured to measure an input voltage at an isolated circuit associated with the auxiliary side winding; and
a processor configured to receive the measured input voltage from the voltage sensing circuit and to cause at least one operation to be performed by the processor based at least in part upon the measured input voltage.

14. The linear isolated power supply circuit of claim 13, wherein the second end of the output resistor is coupled to a voltage source.

15. The linear isolated power supply circuit of claim 13, wherein the at least one operation performed by the processor is an input voltage peak detection operation.

16. The linear isolated power supply circuit of claim 13, wherein the at least one operation performed by the processor is an input voltage minimum detection operation.

17. The linear isolated power supply circuit of claim 13, wherein the processor is configured to calculate at least one of an input power received by the auxiliary side winding and an efficiency of the linear isolated power supply circuit.

* * * * *